(12) United States Patent
Rajsuman et al.

(10) Patent No.: US 6,249,893 B1
(45) Date of Patent: Jun. 19, 2001

(54) METHOD AND STRUCTURE FOR TESTING EMBEDDED CORES BASED SYSTEM-ON-A-CHIP

(75) Inventors: Rochit Rajsuman; Hiroaki Yamoto, both of Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/183,033

(22) Filed: Oct. 30, 1998

(51) Int. Cl.$^7$ .................................................. G06F 11/00
(52) U.S. Cl. ........................ 714/741; 714/742; 714/738; 714/739
(58) Field of Search ................................ 714/720, 732, 714/28, 733, 30, 724, 741, 742, 738, 739

(56) References Cited

U.S. PATENT DOCUMENTS

| | | |
|---|---|---|
| 5,535,164 | 7/1996 | Adams et al. . |
| 5,617,531 | 4/1997 | Crouch et al. . |
| 5,619,512 | 4/1997 | Kawashima et al. . |
| 5,748,640 * | 5/1998 | Jiang et al. .......................... 714/720 |
| 5,825,785 * | 10/1998 | Barry et al. ........................... 714/732 |
| 5,954,824 * | 9/1999 | Cherichetti et al. .................... 714/28 |
| 5,963,566 * | 10/1999 | Rajsuman et al. ..................... 714/733 |
| 5,991,898 * | 11/1999 | Rajski et al. ............................ 714/30 |
| 6,003,142 * | 12/1999 | Mori ...................................... 714/30 |

* cited by examiner

Primary Examiner—Albert Decady
Assistant Examiner—David Ton
(74) Attorney, Agent, or Firm—Muramatsu & Associates

(57) ABSTRACT

A method of testing embedded cores in an integrated circuit chip having a microprocessor core, a memory core and other functional cores therein. The method includes the steps of; forming a plurality of registers in the integrated circuit chip, testing the microprocessor core by executing its instructions multiple times with pseudo random data and evaluating the results by comparing simulation results, applying a test program to the microprocessor core to generate a memory test pattern by the microprocessor core, applying the memory test pattern to the memory core by the microprocessor core and evaluating the response of the memory core by the microprocessor core, and testing the other functional cores by applying a function specific test pattern thereto by the microprocessor core and evaluating the resultant output signals of the functional cores.

17 Claims, 12 Drawing Sheets

Fig.4A

/* Testbench for fault-free MISR signatures*/
Activate test mode; it determines logic values for test mode select and control signals
For opcode I = 1 to N
    Initialize LFSR and MISR
    Load opcode 1 into TCR
    Activate LFSR and MISR for a predetermined number of clocks
    Stop LSFR and MISR
    Record MISR content; this is fault-free signature for instruction 1
Continue

Fig.4B

The simulation run under the above testbench will appear as follows

Activate test mode
Opcode 1 in TCR
    Clock LFSR and MISR for m-cycles (m is predetermined number)
    Take-out MISR signature
Opcode 2 in TCR
    Clock LFSR and MISR for m-cycles
    Take-out MISR signature
Opcode 3 in TCR
    .
    .
Opcode N in TCR
    Clock LFSR and MISR for n-cycles
    Take-out MISR signature

Parallel-out to instruction decode logic

Pseudo random data to execution unit

Fig.10A

```
/* Procedure to test embedded RAM*/
/*A0 is address counter, D0 contains test data (write),
D1 is used for read data (response); A0, D0-D2 are
general purpose registers*/

/*Initialization*/
        MOVE 0000H, A0
    /*Initializing address counter*/
        MOVE 0000H, D0
    /*This is data for memory initialization*/
        MOVE 0000H, D2
    /*This will be used to clear memory word after read
*/

/*Test Procedure*/
Initial   MOVE D0, [A0]
     /*The value in D0 is written into location
   addressed by A0*/
        INCR A0
        COMP A0, FFFFH
     /*FFFFH is the last address*/
        BEQ Test_Incr
        BRA Initial
     /*Memory is initialized, Start test*/

/*Write/Read in increasing order*/
Test_Incr MOVE 0000H, A0
        MOVE 5555H, D0
     /*This is test data (0101...)*/
Cont_Incr MOVE D0, [A0]
     /*This is write operation*/
        MOVE [A0], D1
     /*This is read operation*/
        MOVE D2, [A0]
     /*This clears memory word*/
        COMP D0, D1
        BEQ Next_Incr
        BRA Fail
     /*Read data is not 5555H*/
Next_Incr INCR A0
        COMP A0, FFFFH
     /*Last address*/
        BEQ Test_Decr
        BRA Cont_Incr
```

Fig. 10B

```
/*Write/Read in decreasing order*/
Test_Decr MOVE AAAAH, D0
Cont_Decr MOVE D0, [A0]
        /*This is write operation*/
            MOVE [A0], D1
        /*This is read operation*/
            MOVE D2, [A0]
        /*This clears memory word*/
            COMP D0, D1
            BEQ Next_Decr
            BRA Fail
        /*Read data is not AAAAH*/
Next_Decr DECR A0
            COMP A0, 0000H
        /*0000H is the last address*/
            BEQ Done
            BRA Cont_Decr Done        Write Test_Passed
Fail        Write Test_Failed
```

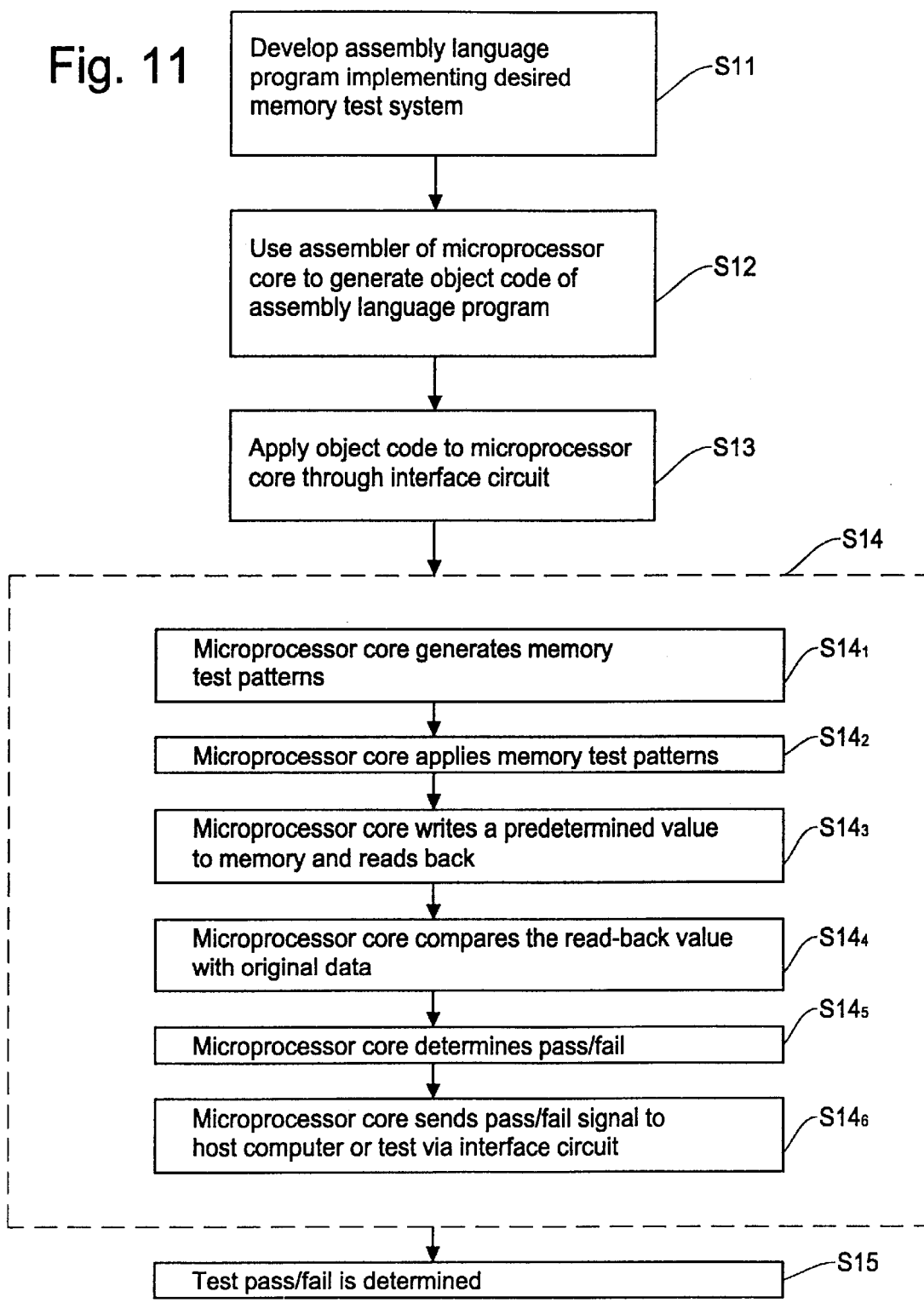

METHOD AND STRUCTURE FOR TESTING EMBEDDED CORES BASED SYSTEM-ON-A-CHIP

FIELD OF THE INVENTION

This invention relates to a method and structure for testing embedded cores based system-on-a-chip, and more particularly, to a method and structure for testing microprocessors, microcontrollers, memories and other functional cores embedded in a large scale integrated circuit (LSI) such as a system-on-a-chip (SoC) IC.

BACKGROUND OF THE INVENTION

In recent several years, ASIC (application specific integrated circuit) technology has evolved from a chip-set philosophy to an embedded core based system-on-a-chip (SoC) concept. An SoC IC includes various reusable functional blocks, such as microprocessors, interfaces, memory arrays, and DSPs (digital signal processors). Such pre-designed functional blocks are commonly called "cores".

FIG. 1 is a schematic diagram showing an example of inner structure of such an SoC IC. In the example of Figure 1, an SoC IC 1 includes a microprocessor core 10, a memory core 3, function specific cores 5–7, a phase lock loop (PLL) core 8, and a test access port (TAP) 9. How to test such embedded cores is a new and complex problem in IC testing. The present invention is directed to a method and structure for testing such embedded cores, such as memory cores, microprocessor and microcontroller (hereinafter "microprocessor") cores, or other function specific cores in an SoC IC.

Microprocessor testing is considered one of the most complex problem in IC testing. In general, an automatic test equipment (ATE) such as an IC tester is commonly used for testing a microprocessor. An IC tester provides a test pattern to the microprocessor under test and the resultant response of the microprocessor is evaluated by expected value data. Because the recent microprocessors have dramatically improved their performance, such as operating speeds, density, functionality, and pin counts, an IC tester for testing such microprocessors needs to be very large scale, high speed, and accordingly very expensive. For example, such an IC tester has several hundreds or more test pins (test channels), each of which includes a pattern generator, timing generator and a frame processor, resulting in a very large and high cost system.

In other approach, various design-for-test (DFT) and built-in self-test (BIST) schemes such as scan, partial scan, logic BIST, scan-based BIST are used to test various logic blocks within a microprocessor. The main problem in these approaches is the requirement of large amount of additional hardware area (extra logic circuits) to implement the test logic. For example, scan implementation in general requires approximately 10% area overhead and scan-based BIST requires approximately 10–15% area overhead on top of the scan implementation. This large area overhead causes larger die, which results into smaller number of dies per wafer, lower yield and higher cost.

In addition, these test schemes also cause a 5–10% performance penalty. Typically, such a performance penalty is a signal propagation delay in the microprocessor because of the additional hardware overhead in the microprocessor. For example, in the scan implementation, each flip-flop circuit in the microprocessor is preceded by a selector (multiplexer) to selectively provide the flip-flop either a scan-in signal or a normal signal. Such an additional selector causes a delay time in the overall performance of the flip-flop circuit. Thus, the design-for-test and built-in self-test schemes adversely affect the microprocessor's performance, such as an operating speed because of the signal propagation delays.

Large embedded (on-chip) memories are the key components in SoC ICs. These embedded memories implement register files, FIFOs (first-in-first-out), data-cache, instruction-cache, transmit/receive buffers, storage for texture processing, etc. Testing of embedded memories is generally done by one of the following methods:

(1) Direct application of test patterns to an embedded memory under test by an IC tester while accessing the memory through an I/O multiplexing: This method requires modification in the I/Os (input/output) of an SoC by adding a multiplexer therein. Due to this extra multiplexer, there is a permanent penalty, for example, a signal propagation delay, in the performance of the SoC IC. The test patterns are generated by an IC tester's pattern generator such as an ALPG (algorithmic pattern generation) unit. However, due to the multiplexer at the I/Os, the actual test patterns require serialization (parallel to serial conversion) of the ALPG patterns, which increases test complexity, test time and many time losses of at-speed testing.

(2) Test application to an embedded memory under test through local boundary scan or a collar register: This method adds a wrapper (boundary scan or shift-register type wrapper) to an embedded memory to be tested. Thus, the data transfer rate to and from the memory under test slows down by the time equal to the delay of the wrapper. Moreover, during testing, the test patterns are serially shifted-in and response is serially shifted-out. Thus, the test time increases significantly and at-speed testing is not possible.

(3) Memory built-in self-test (BIST): This method requires an additional inner circuit for on-chip test generation and response evaluation. This method is the costliest in terms of hardware overhead (additional chip area). The commercially available memory built-in self-test methods require about 3–4% area overhead for a 16K-bits memory. Also, due to additional circuit parasitic, about 1–2% performance penalty, such as signal propagation delays, occurs in memory read/write operations.

(4) Through ASIC functional test: For some small memory, ASIC vendors include simple write/read operations in the ASIC functional test. Most of the time, 1010 . . . 10 pattern is written and read. Generally, this method is applicable to only small memories and extensive testing is not done by this method.

Because the memory built-in self-test causes very little performance penalty at the chip's I/Os, only about 1–2% penalty in the memory read/write operations and provides an acceptable test time, the memory built-in self-test is increasingly used for embedded memories in system-on-chips. Various types of memory built-in self-test methods are available in the market. However, all the known memory built-in self-test methods are very costly in-terms of hardware overhead and allow only a limited number of memory test algorithms. Another limitation of these methods is that if fault diagnosis is desired, these methods require a significantly large amount of additional hardware to identify the failed bit locations.

As has been foregoing, the conventional test approach using the IC tester or design-for-test scheme is not cost-effective for testing embedded cores in a large scale integrated circuit such as an SoC IC.

SUMMARY OF THE INVENTION

Therefore, it is an object of the present invention to provide a method and structure for testing embedded cores in a system-on-a-chip (SoC) IC, with substantially no increase in the hardware in the SoC IC.

It is another object of the present invention to provide a method and structure for testing embedded cores in a system-on-chip SoC) IC, with substantially no penalty in the performance of the SoC IC.

It is a further object of the present invention to provide a method and structure for testing embedded cores in a system-on-chip SoC) IC with high test efficiency and low cost.

One aspect of the present invention is a method of testing embedded cores in an integrated circuit chip having a microprocessor core, a memory core and other functional cores therein. The method is comprised of the steps of: providing a plurality of registers to be used for testing the microprocessor core in the integrated circuit chip; testing the microprocessor core by executing its instructions multiple times under pseudo random data and evaluating the results by comparing simulation results; using an assembly language test program running on the microprocessor core to generate a memory test pattern by the microprocessor core; applying the memory test pattern to the memory core by the microprocessor core and evaluating the response of the memory core by the microprocessor core; and testing the other functional cores by applying a function specific test pattern thereto by the microprocessor core and evaluating the resultant output signals of the functional cores.

Another aspect of the present invention is a structure for testing embedded cores. The structure is comprised of: a plurality of registers formed in the integrated circuit chip, means for executing microprocessor instructions with pseudo random data and evaluating the results; and a host computer for providing an executable test program to the microprocessor core through an interface circuit; wherein the memory core is provided with a memory test pattern generated by the microprocessor core and the resultant output of the memory core is evaluated by the microprocessor core, and the other functional cores are provided with a function specific test pattern by the microprocessor core and the resultant output signals are evaluated by the microprocessor core.

According to the present invention, the test method does not require large area overhead (it requires only three registers in a microprocessor core). The new test method causes no performance penalty. This method is applicable to standard product microprocessors, memories as well as embedded microprocessors, memories cores, embedded functional cores, and system-on-a-chips.

BRIEF DESCRIPTION OF THE DRAWINGS

FIGS. 4A and 4B show examples of pseudo-code for simulation testbench to collect fault free values of MISR (multi-input feedback shift register) for each instruction in accordance with the present invention.

FIGS. 10A and 10B show an example of assembly language test program to be applied to a microprocessor core in a system-on-chip (SoC) IC from an external source.

FIG. 11 is a flow chart showing a process of testing a memory core in a system-on-chip (SoC) IC in accordance with the present invention.

DETAILED DESCRIPTION OF THE PREFERRED EMBODIMENTS

The present invention provides a method and structure for testing a system-on-chip (SoC) IC, which contains one or more microprocessor cores, a memory core, and one or more function-specific cores. In this method, a microprocessor core is first tested, then the computation power of this microprocessor core is utilized to generate the memory test pattern, apply the test patterns to the embedded memory to be tested and evaluate the test response thereof to determine a fault. Except for negligible hardware added to the microprocessor core, this test method does not need any design modifications or additional circuits (hardware overhead) as used in the conventional design for-test and built-in self-test methods.

More specifically, to detect a functional failure of a system-on-chip IC, the test method of the present invention is carried out as follows:

STEP 1: Testing of microprocessor core to ensure the correctness of its functionality. A new method for such testing is described in a separate patent application by the same inventors of the present invention.

STEP 2: Testing of embedded memory core. Once the execution of Step 1 is successful, a test program such as an assembly language program is executed on the microprocessor core to generate test patterns. A new method of memory core testing is also described in another patent application by the same inventors of the present invention.

STEP 3: Testing of function-specific cores. After the testing of microprocessor core and embedded memory, other embedded cores are tested.

Microprocessor Core Testing

Figure 1:
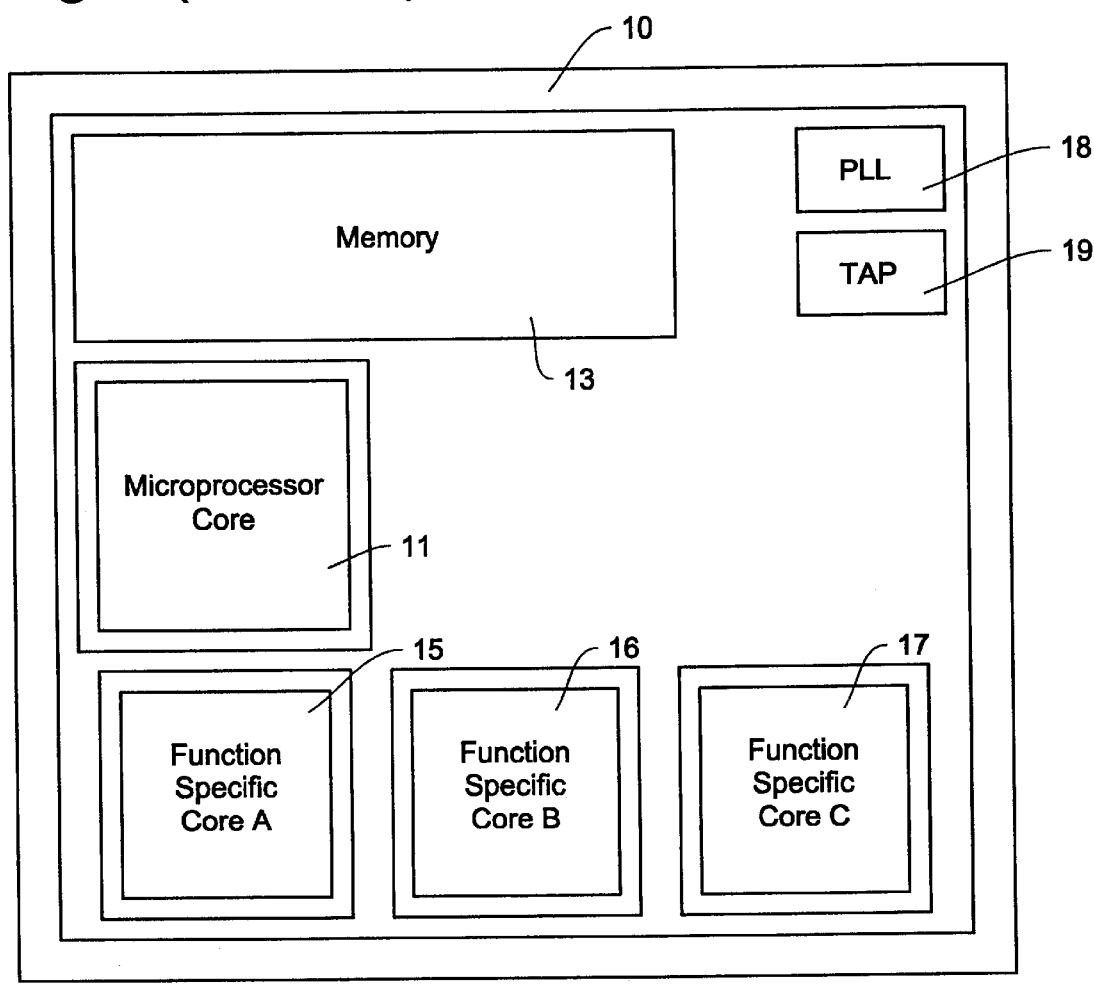
FIG. 1 is a schematic diagram showing an inner structure of a large scale integrated circuit (LSI) which is also called a system-on-chip (SoC) IC having a plurality of embedded cores.
Figure 2:
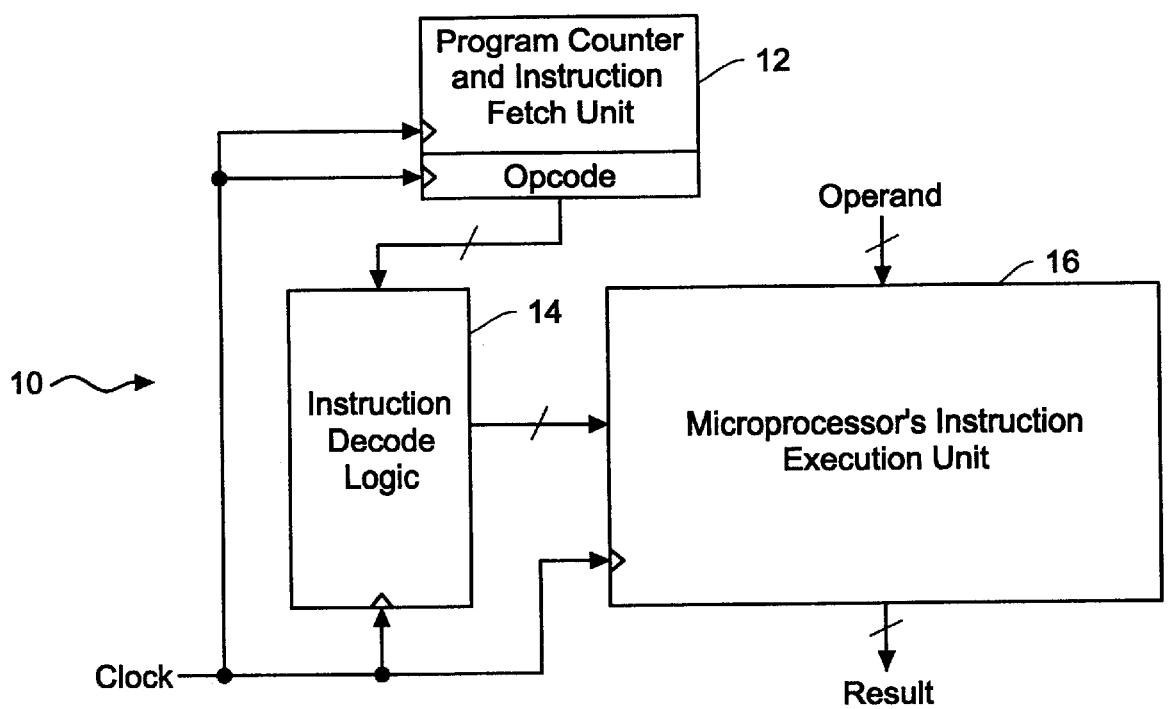
FIG. 2 is a schematic diagram showing a basic structure of a microprocessor core.

The general structure of a microprocessor core is shown in FIG. 2. A typical microprocessor core 10 in FIG. 2 includes a program counter and instruction fetch unit 12, an instruction decode logic 14, an instruction execution unit 16, and a system memory (not shown in FIG. 2). The instruction fetch unit 12 obtains the opcode of the next instruction based upon the address in the program counter. This opcode is decoded by the instruction decode logic 14, which generates function select and control signals for the instruction execution unit 16. The instruction execution unit 16 also receives the operand (data enters or results from the operation) as shown in FIG. 2. Based upon these control signals, one of the logic blocks within the instruction execution unit 16 computes its function. The operand or data for this computation are obtained from the system memory.

For testing the microprocessor core 10 in FIG. 2, the inventors have modified this general structure by three registers and two multiplexers. Here, the basic idea is to use extra registers to scan-in one instruction, execute it multiple times with pseudo random data and take out the resultant signature. One of the extra registers is Test Control Register (TCR) to provide the opcode of microprocessor's instructions during the test mode. Two additional registers, one Linear Feedback Shift Register (LFSR) and another Multi-Input Feedback Shift Register (MISR) are used to generate random data and to compress the test response respectively. The data from LFSR is used as operand for the instruction provided by the TCR. The computed result is stored in MISR. The idea behind using the random data and compression thereof is to substantially reduce the test time and obtain a high fault coverage.

Figure 3:
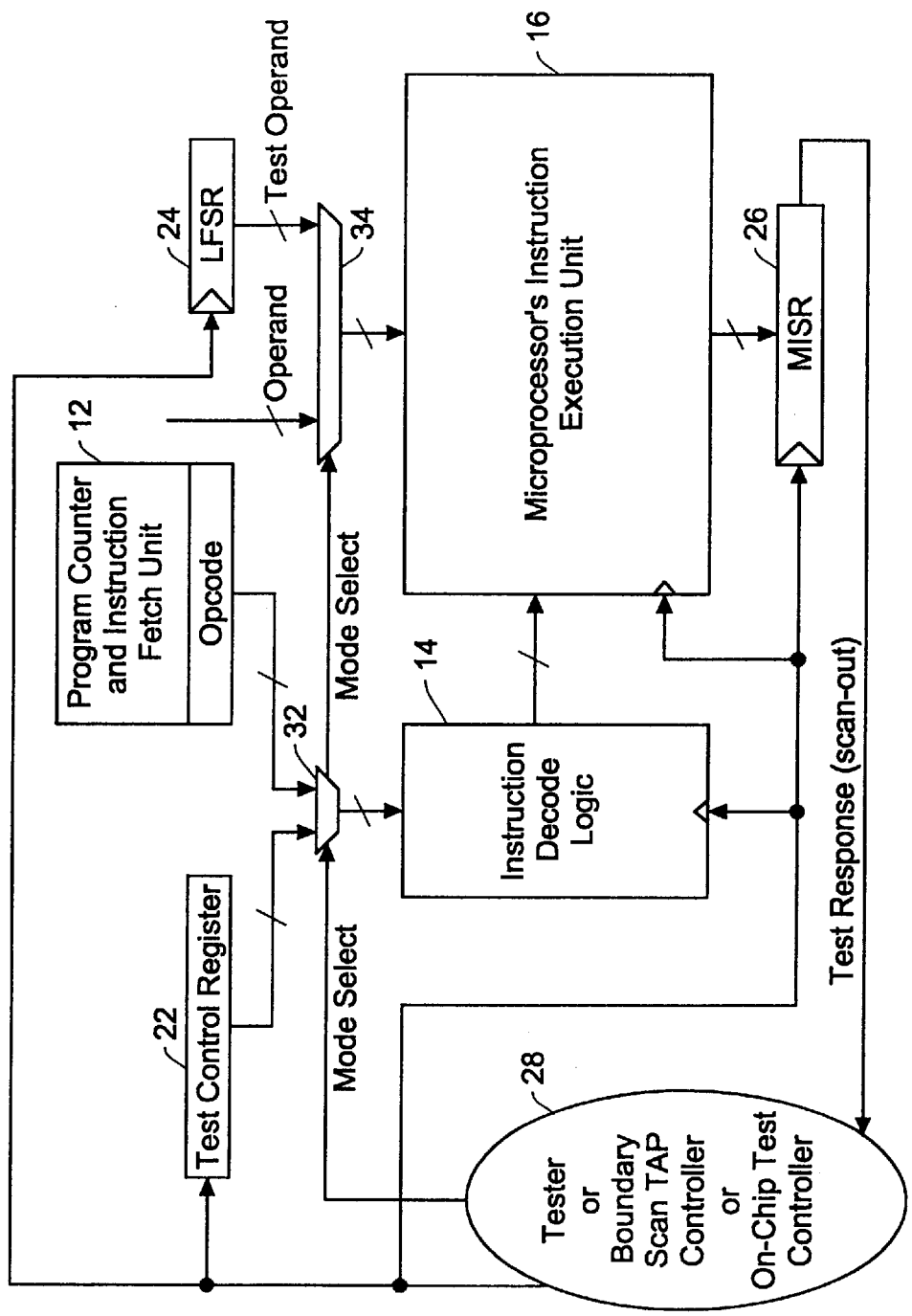
FIG. 3 is a schematic diagram showing an example of modified structure of the microprocessor core in a system-ona-chip (SoC) IC for implementing the test method of the present invention.

This principle is illustrated in FIG. 3. In FIG. 3, it is shown instruction and data flows during a test mode and a normal mode. The additional registers TCR 22, LFSR 24, and MISR 26 as well as additional multiplexers 32 and 34 are also shown. The additional registers TCR 22, LFSR 24, and MISR 26 are used in the test mode. The multiplexers 32 and 34 are used to switch the paths for these additional registers between the test mode and the normal mode. TCR 22 is to provide the opcode of microprocessor's instructions during the test mode. LFSR 24 and MISR 26 are used to generate random test data and to compress the test response, respectively.

LFSR 24 generates the test operand for the instruction provided by TCR 22. The computed result from the execution unit 16 is stored in MISR 26. A multiplexer 32 and a multiplexer 34 are provided to TCR 22 and LFSR 24, respectively, as shown in FIG. 3 to switch between the test mode and the ordinary mode. FIG. 3 also shows a controller 28 which may be an IC tester, a boundary scan TAP (test access port) controller, or an on-chip test controller. The controller 28 is to control an overall test process by transmitting a mode select signal to the multiplexers 32 and 34 as well as test instructions to the microprocessor core 10 under test through TCR 22 and LFSR 24, and compares the resultant response of the microprocessor core 10 with the pre-computed expected value.

In the test mode, by a mode select signal to the multiplexers 32 and 34, TCR 22 and LFSR 24 are electrically connected to the microprocessor core 10. Test instruction is provided to the TCR 22 through the controller 28 (IC tester or other control means) as noted above. The test instruction is then given to the instruction decode logic 14 through the multiplexer 32 and to the instruction execution unit 16. Based on the test instruction, LFSR 24 generates test patterns which are applied to the execution unit 16 through the multiplexer 34. In this example, the test pattern generated by the LFSR 24 is a random pattern as noted above. The resultant output of the execution unit 16 is compressed by MISR 26 to produce a signature which is evaluated by the IC tester or other control means.

The sequence of testing operation in this scheme is summarized as follows:

(1) Activate the test mode. In this mode, contents of TCR 22 are used as instruction rather than that of the instruction fetch unit 12.

(2) Initialize TCR 22, LFSR 24 and MISR 26 either by direct control or via test control signals from the controller 28 which is an IC tester, boundary scan controller or on-chip test controller, depending upon implementation.

(3) Load TCR 22 with the opcode of an instruction. Based upon implementation, it can be either parallel load or serial load (such as scan-in).

(4) Clock LFSR 24 and MISR 26 either for a fixed number of cycles or $2^N-1$ cycles (full length) for N-bit LFSR. This step repeatedly executes the instruction in TCR 22 with LFSR data. For example, if 1,000 clocks are used, the instruction in TCR 22 is executed 1,000 times with 1,000 different operand (random data provided by the LFSR 24).

(5) Take out the content (signature) of MISR 26 to determine pass/fail.

(6) Compare the content of MISR 26 with pre-computed simulation signature to determine if there is a fault. An IC tester or other automatic test equipment (ATE) can perform this comparison.

(7) Repeat the steps (2) to (6) with different instruction until all instructions are exercised.

The above sequence of operation assumes that after the design completion of the microprocessor to be tested, a simulation testbench is developed which exercises all instructions with LFSR data and MISR signatures after each run has been recorded. Thus, the fault free MISR content after the each instruction run is known through the simulation. An example of the pseudo code to develop such simulation testbench for each instruction is given in FIGS. 4A and 4B.

The above procedure determines that each instruction is executed correctly and hence, it provides functional fault coverage. If stuck-at fault (fault in a circuit which causes a line to remain permanently either at logic 1 or at logic 0) coverage is also desired, then fault simulation can be performed with various values of m (number of patterns generated by LFSR). For example, fault simulation with m=1, 000, or 10,000 or exhaustive length will provide different levels of stuck-at fault coverage. Based upon this, one can select a value of m for a particular application. For fault simulation, any commercial EDA tool, such as Cadence's VeriFault can be used.

Figure 5A:
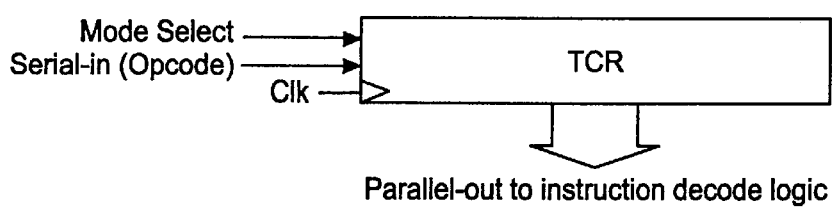
FIGS. 5A–5C are schematic diagrams showing examples of shift registers TCR (test control register), LFSR (linear feedback shift register) and MISR (multi-input feedback shift register) to be used in the test method and structure of FIG. 3.
Figure 5B:
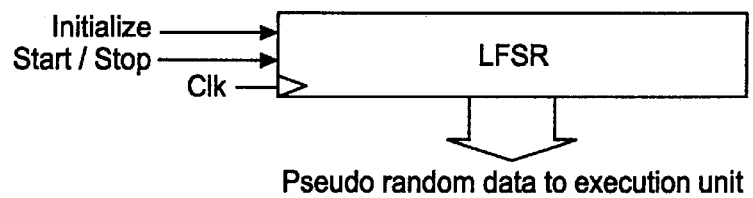
Figure 5C:
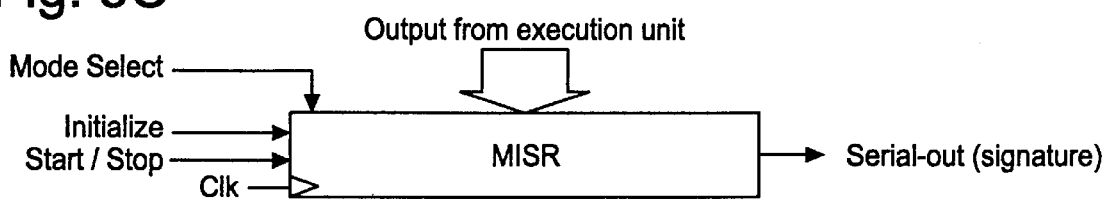

FIG. 5 shows examples of structure of the registers TCR, LFSR and MISR. There can be many ways to implement this scheme depending how the overall control is done. Such control can be obtained by an IC tester, implemented through a boundary scan TAP controller or an independent on-chip test controller. The implementation of TCR, LFSR and MISR will also vary slightly based upon the overall controlling mechanism. Thus, one possible description of TCR, LFSR and MISR is given in FIGS. 5A–5C which provide a behavioral level description (in-terms of input/output form) for which many gate-level or transistor level implementations are possible. In the present invention, the basic requirements for these registers are:

Test control register (TCR): It should be a parallel-out register. It can be either a serial input or parallel input type; however, the parallel input type will cause a large number of wires to become primary input at the chip-level. The serial input implementation will require only one wire to be primary input. If it is implemented as a serial input type, it will also require a mode select signal to switch it from serial-in to parallel-out and vice-versa as shown in FIG. 5A.

Linear feedback shift register (LFSR): It needs initialize and start/stop signals as shown in FIG. 5B. The start/stop signal can be the same as a test control signal or a signal derived from the test control signal, as shown in FIG. 3. Any polynomial can be implemented in LFSR 24, however, prime polynomial is advantageous to obtain $2^N-1$ patterns. The pseudo random pattern generated by LFSR 24 is provided to the execution unit 16.

Multi-Input feedback shift register (MISR): It also needs initialize and start/stop signals as shown in FIG. 5C. In addition, it also needs a serial-out and a mode-select signal to switch it from a data compression mode to a shift register mode and vice-versa. Instead of serial-out, it can be parallel out, however, that will cause a large number of wires to be primary output at the chip-level. The start signal of MISR 26 can be derived from the start signal of the LFSR 24. To avoid the unknown data in a pipeline of the execution unit 16, the start signal for MISR 26 should be delayed by a time equal to (or more) the latency of pipeline.

Figure 6A:
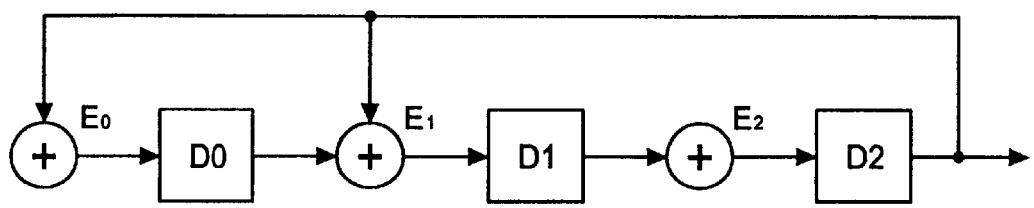
FIGS. 6A and 6B are block diagrams showing further examples of structure of LFSR (linear feedback shift register) and MISR (multi-input feedback shift register) of FIG. 5B and SC.
Figure 6B:
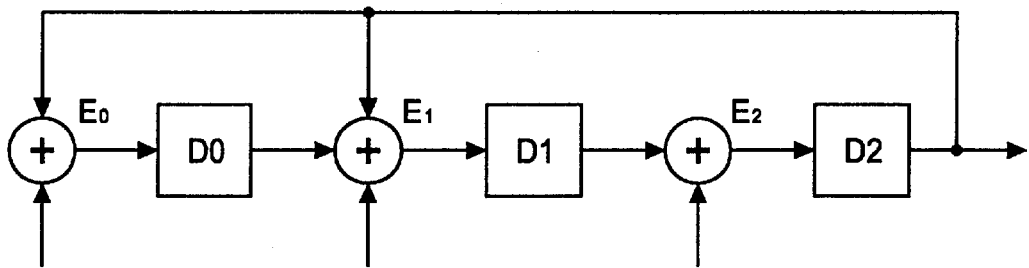

FIGS. 6A and 6B show examples of LFSR and MISR in a flip-flop level. An example of LFSR in FIG. 6A is formed of series connected D flip-flops D0–D2 and exclusive OR gates E0–E2 for establishing feedback connections for the flip-flops. As is well known in the art, this structure is to generate a pseudo random signal. An example of MISR in FIG. 6B is substantially the same as LFSR except for an additional input at each of the exclusive OR gates E0–E2.

The control of this scheme can be implemented in many ways as indicated by the examples of controller 28 in FIG. 3. The implementation directly through the logic tester (ATE) is straightforward. In such a case, the logic tester provides the clock and test control signals as well as evaluates the test response (MISR signature) to determine pass/fail.

In a case when an IC under test has either an on-chip test controller or boundary scan capability, the test control signals and test response is passed through (or even controlled by) the on-chip test controller or boundary scan TAP controller. For example, RUNBIST instruction in the boundary scan TAP controller can be implemented to generate the test control signals; the opcode in TCR can be scanned-in and test response can be scanned-out through the TAP controller.

Figure 7:
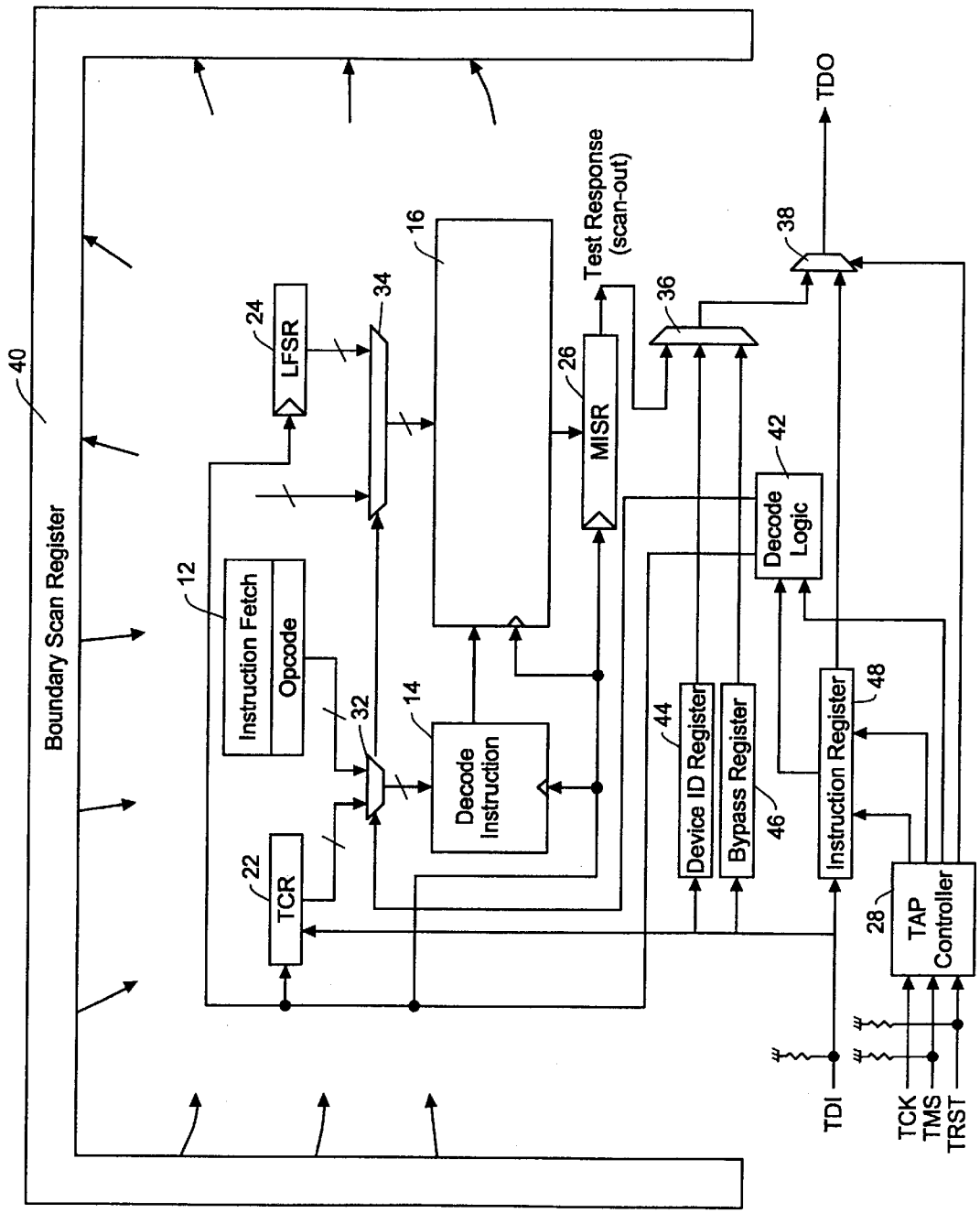
FIG. 7 is a schematic block diagram showing an example of structure for implementing the present invention through a boundary scan TAP (test access port) controller.

FIG. 7 illustrates such implementation by the boundary scan TAP controller, which is based on a standard boundary scan architecture defined by IEEE/ANSI standard 1149.1. A boundary scan register (scan chain) 40 is introduced at input-output pins of the microprocessor to be tested. A test data input (TDI) pin is connected to an instruction register 48 as well as to TCR 22, a device ID register 44, a bypass register 46. The TAP controller 28 includes I/O pins of a test clock (TCK), test mode select signal (TSM) and test reset (TRST). Multiplexers 36 and 38 are provided to transmit the signature from MISR 26 to a test data output (TDO) pin. In this arrangement, the test is performed by shifting the test vectors and instructions into the microprocessor 10 through the TDI pin, TCR 22 and LFSR 24, and scanning out the response of the microprocessor 10 through MISR 26 and the TDO pin.

Both FIGS. 3 and 7 show the execution unit as a black box. Depending upon the IC, it can be a simple ALU or a group of complex blocks implementing integer and floating point arithmetic and logic operations. One such example is given in FIG. 8.

Figure 8:
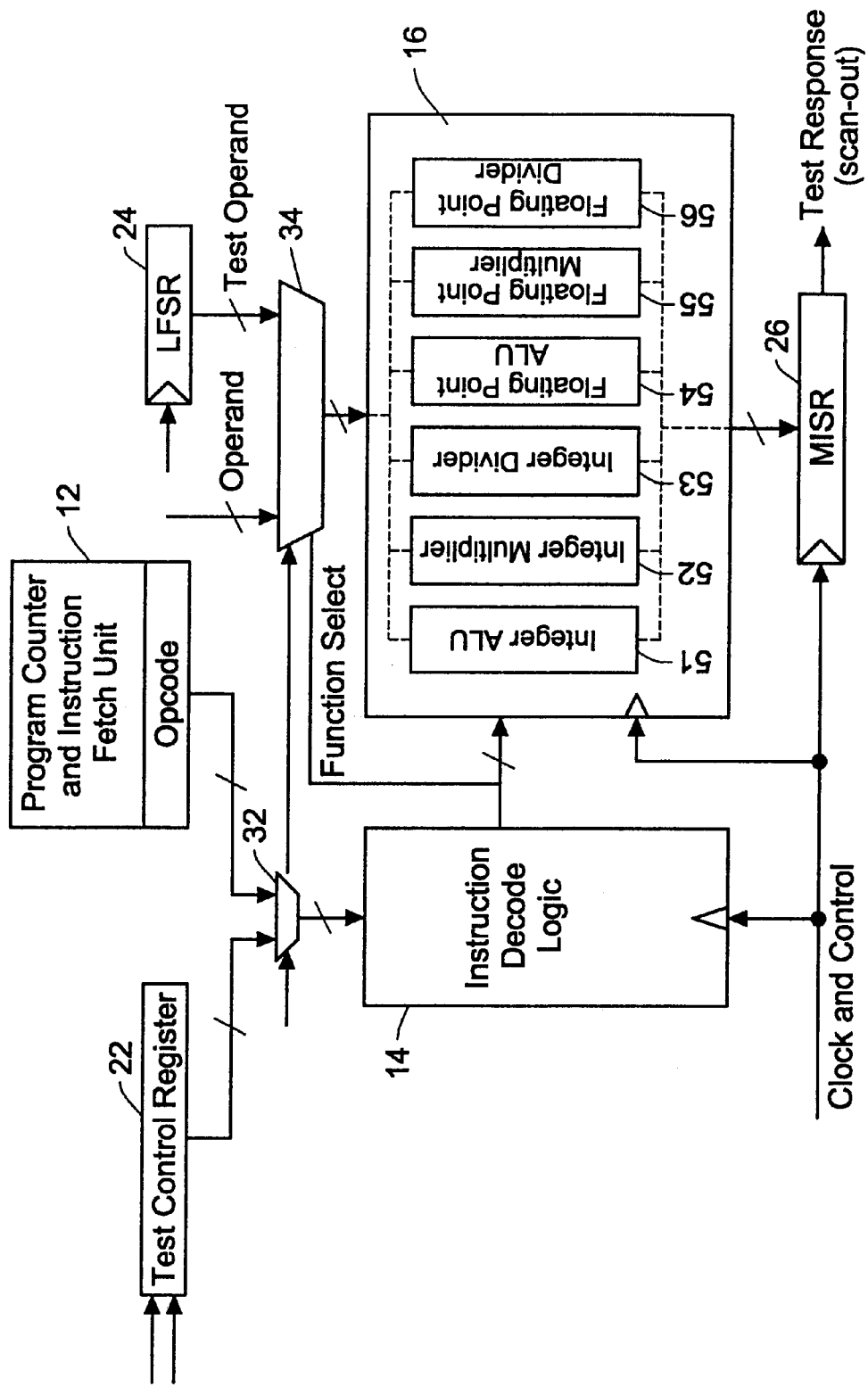
FIG. 8 is a schematic block diagram showing an example of structure for implementing the present invention for testing a microprocessor core having a complex execution unit.

In the example of FIG. 8, an execution unit 16 includes multiple blocks of integer and floating point arithmetic units 51–56. However, it should be noticed from FIG. 8 that the implementation of this new test method has not changed and it is still the same as FIGS. 3 and 7. The only difference is that the function select multiplexer 34 of the execution unit 16 has been modified so that it will also function as the operand select multiplexer. In FIGS. 3 and 7, there is no function select multiplexer, hence, an additional multiplexer is added to select LFSR data as operand during testing corresponding to each of the arithmetic functions 51–56. In another situation when a function select multiplexer is implemented inside the execution unit 16, the implementation of test method will be identical to that shown in FIGS. 3 and 7.

The major benefits of the present invention is that the hardware overhead in this scheme is negligible and it provides 100% functional fault coverage and additional stuck-at fault coverage. The hardware overhead needed in this invention is negligible and it causes no performance penalty in the normal operation of the IC. The present invention is applicable to a wide range of ICs such as standard product microprocessors or microcontrollers, embedded microprocessors, embedded cores, 2D/3D graphics accelerators, DSP, audio/video and multi-media chips.

This scheme provides following two kinds of fault coverage:

(1) Functional fault coverage: As each instruction is executed multiple times with different data, it ensures the functional correctness of each instruction.

(2) Stuck-at fault coverage: As different lines are sensitized depending upon instruction in the TCR and LFSR data, comparing MISR signature with simulation signature ensures that various lines do not have stuck-at faults. The fault simulation of the gate level model of the execution unit with LFSR, MISR and TCR can quantify the exact stuck-at fault coverage during manufacturing testing.

In terms of area overhead, this scheme requires only three extra registers and at-most two multiplexers. The three registers are, one TCR of length equal to microprocessor's word-size (width of instruction), one LFSR and one MISR. Both LFSR and MISR can be of any length. For all practical purposes either 16-bits or 32-bits wide LFSR and MISR are good enough. If the width of data bus is different than the width of LFSR, multiple fan-out can be taken from LFSR output to match the data-width.

Memory Core Testing

Once the integrity of the microprocessor core is affirmed, the computation power of this microprocessor core is utilized to test the memory core in the SoC IC. The microprocessor core generates memory test patterns, applies the test patterns to the embedded memory core to be tested and evaluates the test response thereof to determine a fault.

Figure 9:
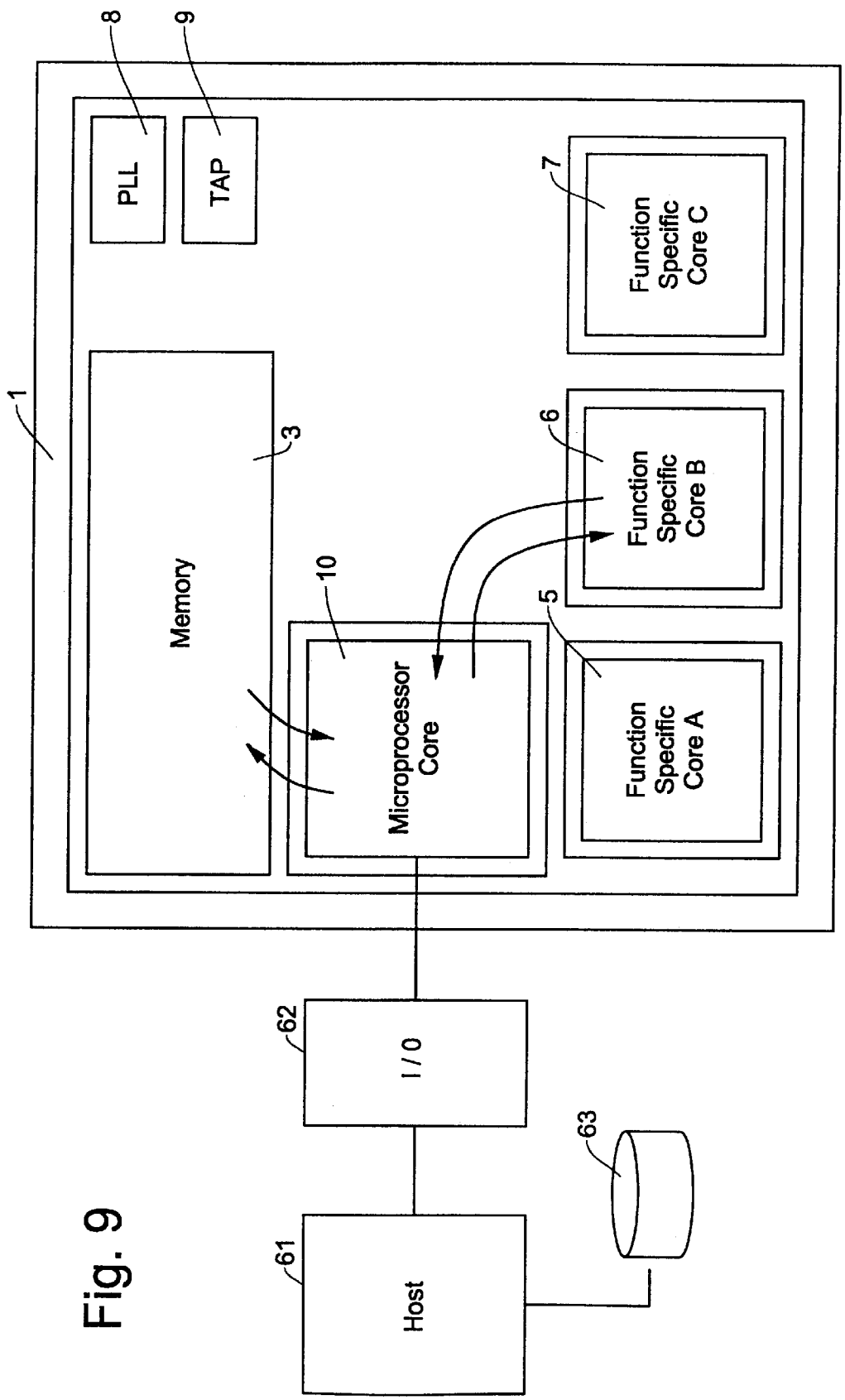
FIG. 9 is a schematic diagram showing a structure for testing a memory core in a system-on-chip (SoC) IC in accordance with the present invention.

As noted above, when the microprocessor core in the SoC IC is determined to be satisfactory, the microprocessor core is used as a test pattern generator for the embedded memory core. FIG. 9 is a schematic block diagram showing a structure for testing a memory core 3 by using the embedded microprocessor core 10 whose integrity has been verified. In FIG. 9, a host computer 61, a hard disk 63 and an I/O interface 62 are provided outside of the SoC IC 1. Typically, the hard disk 63 stores the test program to be used in testing the memory core 3. The host computer 61 provides the executable code of assembly language test program to the microprocessor core 10 in the SoC chip 1 through the I/O interface 62. A conventional IC tester can also be used to provide the test program to the microprocessor core 10 and to store the test results. However, such a tester may not be necessary and any other means can be used as long as the assembly language test program can be sent to the microprocessor core 10.

The assembly language test program is converted into binary form by the assembler of the microprocessor core 10.

This assembler may reside in the host computer or the tester, outside the SoC. Thus, the microprocessor core 10 generates a test pattern from the object code. These test patterns are applied to the memory core 3. According to the algorithm of the test pattern, write data is written in the specified addresses of the memory core 3. The microprocessor core 10 reads the stored data in the memory core 3 to compare the same with the original test data prepared by the microprocessor core 10, which is typically the write data. When the data read from the memory core 3 does not match the expected data, failure information is sent to the host computer 61.

An example assembly language procedure using simplified memory marching algorithm is shown in FIGS. 10A and 10B. This example uses word-wide read/write operations with 0101 . . . 01 data in increasing order and 1010 . . . 10 in decreasing order, while the size of memory is assumed as 16K×16 RAM.

The marching pattern in FIGS. 10A and 10B is used only for an illustration purpose, the test methodology of the present invention is not limited to it and any algorithm can be used. Examples of other test patterns are a galloping or ping-pong pattern and a checker pattern, and etc.

It should also be noted that the test program as shown in the foregoing may stop as soon as an error occurs. The host computer or IC tester immediately observes the failure and hence, fail-bit location is immediately known. Furthermore, a user can modify the program shown in the above in various ways to collect any desired test information of the embedded memory. In some sense, this method is equivalent to the conventional direct test access mechanism without requiring pin multiplexing and pattern serialization. Because this test method does not require any design modification or hardware overhead for test application or resultant response evaluation, this method can potentially replace the conventional memory BIST method for SoC designs with microprocessor cores.

FIG. 11 is a flow chart showing the operational process of the memory core testing. In the step S11, an assembly language test program is developed for implementing a desired memory test algorithm. Then an object code of the assembly language test program is generated in the step S12 by using assembler of the microprocessor core 11 within the SoC or of the host computer or tester outside the SoC. Through the interface circuit 62, the object code is applied to the microprocessor core 10 in the step S13.

The step S14 defines the actions by the microprocessor core 10. The step S14 is formed of steps $S14_1$–$S14_6$. The microprocessor core 10 generates memory test patterns in the step $S14_1$ and applies the memory test patterns to the memory core 3 in the step $S14_2$. In the step $S14_3$, the microprocessor core 10 writes a predetermined value to the memory core 3 and reads back the same. The microprocessor core 10 compares the read-back value with the original data in the step $S14_4$ and determines pass/fail of the memory core 3 in the step $S14_5$. Then the microprocessor core 10 sends a pass/fail signal to the host computer or tester via the interface circuit 62. In the last step S15, test pass/fail is determined by the host computer or tester. The memory test method in the present invention is different in two fundamental ways from other test methods:

(1) This method does not require that the instruction-cache or any other on-chip memory be first tested by the BIST or direct access test method. The invention treats all the on-chip memories equivalently and does not require a known good on-chip memory.

(2) In the present invention, the binary of the assembly language test program is generated off-line using the microprocessor assembler.

The major advantage of the present invention is that no additional test circuitry is required. It does not require any design modification in the chip design. There is no performance penalty and the memory is tested at speed. The user can use any memory test algorithm to test embedded SRAM, DRAM or any kind of memories. The method also provides full fault diagnosis (failed bit location in embedded memory) without any extra hardware.

Function-Specific Core Testing

Similar to the memory core testing, once the integrity of the microprocessor core is affirmed, the computation power of this microprocessor core is utilized to test the other embedded cores in the SoC IC. The microprocessor core generates function specific test patterns, applies the test patterns to the embedded cores to be tested and evaluates the test response thereof to determine a fault.

This interaction is schematically shown in FIG. 9 by arrows between the microprocessor core 10 and the function specific core 6. Again, an assembly language program running on the microprocessor core 10 generates the test patterns for function specific core 6, while the microprocessor core 10 or a simple comparator circuit determines the fault. In the case where an SoC IC contains multiple copies of the same core, a comparator circuit is used to detect the fault while same tests are applied to all copies of the core.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A method for testing embedded cores in an integrated circuit chip having a microprocessor core, a memory core and other functional cores therein comprising the following steps of:

providing a plurality of registers to be used for testing the microprocessor core in the integrated circuit chip;

testing the microprocessor core by executing its instructions multiple times with pseudo random data and evaluating the results by comparing with simulation results;

applying a test program to the microprocessor core to generate a memory test pattern by the microprocessor core;

applying the memory test pattern to the memory core by the microprocessor core and evaluating the response of the memory core by the microprocessor core; and testing the other functional cores by applying a function specific test program thereto by the microprocessor core and evaluating the resultant output signals of the functional cores;

wherein the plurality of registers is comprised of a test control register for providing test instructions to an instruction decoder of the microprocessor core, a linear feedback shift register for providing test operand to an instruction execution unit of the microprocessor core, and a multi-input feedback shift register for receiving results from the instruction execution unit of the microprocessor core.

2. A method for testing embedded cores as defined in claim 1, wherein the step of testing the microprocessor core is comprised of the following steps of:

activating a test mode;

initializing the test control register, the linear feedback shift register, and the multi-input feedback shift register;

loading the test control register with opcode of a test instruction;

providing contents of the test control register to the instruction decoder;

clocking the linear feedback shift register and multi-input feedback shift register either for a fixed number of cycles or $2^N-1$ cycles, where N is a number of stages of the linear feedback shift register and multi-input feedback shift register;

taking out contents (signature) of the multi-input feedback shift register;

comparing the signature of the multi-input feedback shift register with pre-computed simulation signature to determine if there is a fault; and repeating the foregoing steps with different instruction until all instructions are exercised.

3. A method for testing embedded cores as defined in claim 1, wherein the test program applied to the microprocessor core is an object code of assembly language test program.

4. A method for testing an embedded memory as defined in claim 3, wherein the assembly language test program is provided to the microprocessor core from an external host computer through an I/O interface.

5. A method for testing an embedded memory as defined in claim 3, wherein the assembly language test program is provided to the microprocessor core from an external IC tester through an I/O interface.

6. A structure for testing embedded cores in an integrated circuit chip having a microprocessor core, a memory core and other functional cores therein comprising:

a plurality of registers formed in the integrated circuit chip, the plurality of registers including a test control register for providing test instructions to an instruction decoder of the microprocessor core, a linear feedback shift register for providing test operand to an instruction execution unit of the microprocessor core, and a multi-input feedback shift register for receiving results from the instruction execution unit of the microprocessor core;

means for executing instructions multiple times with pseudo random data and comparing the results received by the multi-input feedback shift register with pre-computed expected data; and a host computer for providing a test program to the microprocessor core through an interface circuit for generating test patters for the memory core or other functional cores;

wherein the memory core is provided with a memory test pattern generated by the microprocessor core and a resultant output of the memory core is evaluated by the microprocessor core, and the other functional cores are provided with a function specific test pattern by the microprocessor core and resultant output signals are evaluated by the microprocessor core.

7. A structure for testing embedded cores in an integrated circuit chip having a microprocessor core, a memory core and other functional cores therein, comprising:

a test control register for providing test instructions to an instruction decoder of the microprocessor;

a first multiplexer for selecting either the test instructions from the test control register or instructions from an instruction fetch unit of the microprocessor;

a linear feedback shift register for providing test operand to an instruction execution unit of the microprocessor;

a second multiplexer for selecting either the test operand from the linear feedback shift register or operand from a main memory of the microprocessor;

a multi-input feedback shift register for receiving results from the instruction execution unit of the microprocessor; and a controller for providing the test instruction to the test control register and the linear feedback shift register, and evaluating an output signature of the multi-input feedback shift register by comparing the output signature with precomputed expected data; and means for providing a test program to the microprocessor core through an interface circuit for generating test patterns for the memory core or other functional cores;

wherein the memory core is provided with a memory test pattern generated by the microprocessor core and a resultant output of the memory core is evaluated by the microprocessor core, and the other functional cores are provided with a function specific test pattern by the microprocessor core and resultant output signals are evaluated by the microprocessor core.

8. A structure fir testing embedded cores as defined in claim 7, wherein the linear feedback shift register generates the test operand which is a random test pattern, and an output of the instruction execution unit responsive to the random test pattern is compressed by the multi-input feedback shift register.

9. A structure for testing embedded cores as defined in claim 7, wherein the controller provides the test instruction to the test control register and to the linear feedback shift register wherein the test instruction is simulated by a simulation testbench at the design stage of the integrated circuit chip and the pre-computed expected data is prepared in the controller prior to the start of the test by the test structure to compare the pre-computed expected data with the output data of the multi-input feedback shift register.

10. A structure for testing embedded cores as defined in claim 7, wherein the controller is either an external IC tester, a test access port controller in a boundary scan architecture in the integrated circuit chip, or an on-chip controller in the integrated circuit chip.

11. A structure for testing embedded cores as defined in claim 7, wherein the test control register receives the test instruction from the controller in series and sends the test instruction to the instruction decode logic in parallel.

12. A structure for testing embedded cores as defined in claim 7, wherein the linear feedback shift register includes a plurality of series connected flip-flops and at least one exclusive OR gate which feedbacks an output signal of a later stage flip-flop to an input of a former stage flip-flop, the linear feedback shift register having an initialize input for initializing the series connected flip-flops and a start/stop input for controlling start and stop operations of the linear feedback shift register.

13. A structure for testing embedded cores as defined in claim 7, wherein the multi-input feedback shift register includes a plurality of series connected flip-flops and two or more exclusive OR gates at least one of which feedbacks an output signal of a later stage flip-flop to an input of a former stage flip-flop, the multi-input feedback shift register having two or more inputs connected to the corresponding exclusive OR gates, an initialize input for initializing the series connected flip-flops and a start/stop input for controlling start and stop operations of the multi-input feedback shift register.

14. A structure for testing embedded cores as defined in claim 7, wherein the second multiplexer further includes a function select capability for selectively providing the test operand to corresponding arithmetic units when the instruction execution unit has a plurality of arithmetic units therein.

15. A structure for testing embedded cores as defined in claim 6, wherein the test program applied to the microprocessor core is an object code of assembly language test program.

16. A structure for testing embedded cores as defined in claim 15, wherein the assembly language test program is provided to the microprocessor core from an external host computer through an I/O interface.

17. A structure for testing embedded cores as defined in claim 15, wherein the assembly language test program is provided to the microprocessor core from an external IC tester through an I/O interface.

\* \* \* \* \*